(12) United States Patent
Arabi et al.

(10) Patent No.: US 6,449,742 B1
(45) Date of Patent: Sep. 10, 2002

(54) TEST AND CHARACTERIZATION OF SOURCE SYNCHRONOUS AC TIMING SPECIFICATIONS BY TRACE LENGTH MODULATION OF ACCURATELY CONTROLLED INTERCONNECT TOPOLOGY OF THE TEST UNIT INTERFACE

(75) Inventors: Tawfik Arabi, Tigard; Dave Riendeau, Beaverton; Srirama Pedarla, Portland, all of OR (US); Greg Eberlein, Sunnyvale; Gary Andrew, El Dorado, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/372,654

(22) Filed: Aug. 11, 1999

(51) Int. Cl.[7] .............................................. G01R 31/28
(52) U.S. Cl. ...................................... 714/735; 714/744
(58) Field of Search ................................ 714/724, 734, 714/735, 738, 744, 100, 101; 324/73.1

(56) References Cited

U.S. PATENT DOCUMENTS

| | | | |
|---|---|---|---|
| 5,621,741 A | * 4/1997 | Kohiyama | 371/27 |
| 5,831,994 A | * 11/1998 | Takino | 714/724 |
| 5,889,936 A | * 3/1999 | Chan | 395/183.15 |
| 6,243,841 B1 | * 6/2001 | Mydill | 714/724 |
| 6,311,300 B1 | * 10/2001 | Omura et al. | 714/724 |
| 6,324,665 B1 | * 11/2001 | Fay | 714/724 |

* cited by examiner

Primary Examiner—Albert Decady
Assistant Examiner—Matt Dooley
(74) Attorney, Agent, or Firm—Blakely, Sokoloff, Taylor & Zafman LLP

(57) ABSTRACT

An apparatus that can determine whether a Tva parameter and a Tvb parameter of a device under test (DUT) complies with a design specification where the device under test is coupled to a secondary device. The Tvb parameter corresponds to a setup time of the secondary device. The Tva parameter corresponds to the hold time of the secondary device. The apparatus allows the DUT to be coupled to a secondary device that normally operates with the DUT. The apparatus writes data to the DUT and secondary device. The data is then written back to the apparatus which then determines whether the DUT complies with the Tvb and Tva design specifications. The apparatus may also implement tunable delay circuits to compensate for different setup and hold times of the secondary device.

19 Claims, 2 Drawing Sheets

TEST AND CHARACTERIZATION OF SOURCE SYNCHRONOUS AC TIMING SPECIFICATIONS BY TRACE LENGTH MODULATION OF ACCURATELY CONTROLLED INTERCONNECT TOPOLOGY OF THE TEST UNIT INTERFACE

BACKGROUND OF THE INVENTION

1. Field of the Invention

The present invention relates to a tester and method for testing an integrated circuit.

2. Background Information

Microprocessors typically receive and transmit data through busses that are connected to memory or input/output (I/O) devices. The data signal(s) is typically latched into the processor with a clock signal. FIG. 1 shows a timing diagram for the data and clock signals on a bus connected to a processor. The leading edge of the clock signal is generated subsequent to the leading edge of the data signal. The time period between the leading edge of the data signal and the leading edge of the clock signal is commonly referred to as the Tvb parameter. The time period between the trailing edges of the clock and data signals is commonly referred to as the Tva parameter. The Tvb parameter is the sum of a setup time required by the processor and a setup margin. The Tva parameter is the sum of a hold time required by the processor and a hold margin. The Tvb and Tva parameters are typically specified for every integrated circuit that reads data. For example, a microprocessor and accompanying bus will have a Tvb and Tva specification. When manufacturing microprocessors, it is desirable to test the individual processors to determine compliance with the Tvb and Tva design parameters.

FIG. 2 shows a tester or automatic test equipment (ATE) 1 of the prior art that is used to determine whether a microprocessor 2 meets the required Tvb and Tva design specifications. The ATE 1 may be connected to both a frontside bus 3 and a backside bus 4 of the processor 2. The ATE 1 may write data to the processor 2 through the frontside bus 3. The processor 2 may then write the same data back to the ATE 1 through the backside bus 4. The ATE 1 determines the relative positions of the leading and trailing edges of the data and clock signals received from the processor 2 to determine the Tvb and Tva values. The ATE 1 then compares the actual Tvb and Tva values with the Tvb and Tva design values to determine if the processor meets the specification.

Microprocessors are continuously being designed to operate at higher speeds. To effectively test the new designs the ATE must be upgraded to operate at the higher frequencies. Upgrading the ATE can be expensive and increase the cost of testing the integrated circuits. Additionally, there is typically an error associated with measuring the edges of the signals and the corresponding Tva and Tvb parameters. The errors reduce the accuracy of the test and thus increase product cost by reducing yield. It would be desirable to provide a tester and method for testing an integrated circuit that is relatively independent of the circuit operating speed.

Integrated circuits are typically assembled into packages that are mounted to a printed circuit board. The integrated circuits are typically tested after being assembled into the package but before being mounted to the printed circuit board. The ATE may have a plurality of spring loaded pogo pins that engage the electrical contacts of the package. For the above described microprocessor the tester must have pogo pins for both the frontside and backside busses. The cost of the tester is proportional to the number of pogo pins. It would be desirable to provide a tester for a frontside/backside processor that eliminated some of the pogo pins required to test the processor.

SUMMARY OF THE INVENTION

One embodiment of the present invention is an apparatus for testing a device under test (DUT) that can be coupled to a secondary device. The ATE may have a frontside bus coupled to the DUT and a backside bus coupled to the DUT and the secondary device.

DETAILED DESCRIPTION

Figure 1:
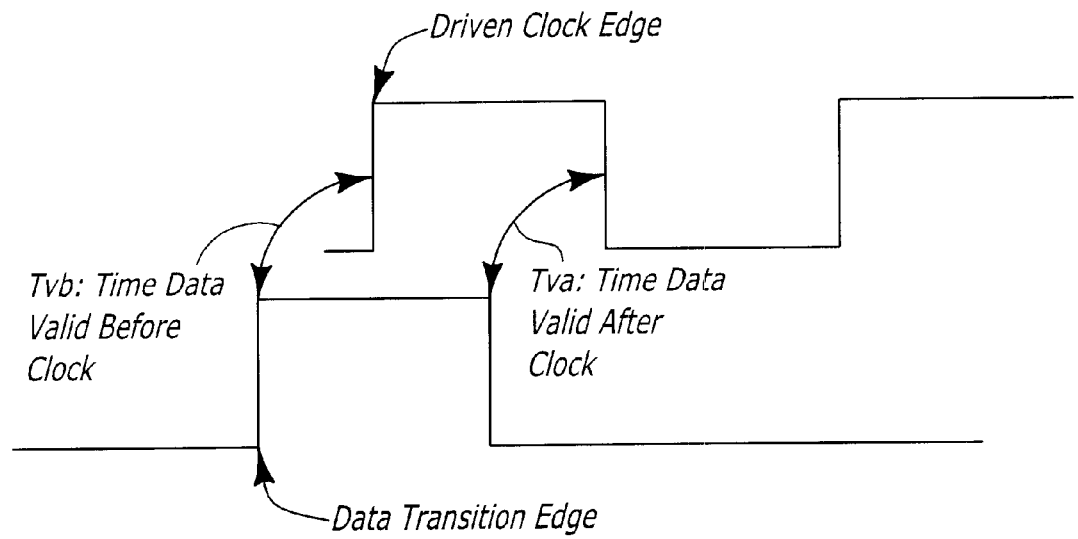
FIG. 1 is a timing diagram showing a data signal and a clock signal.
Figure 2:
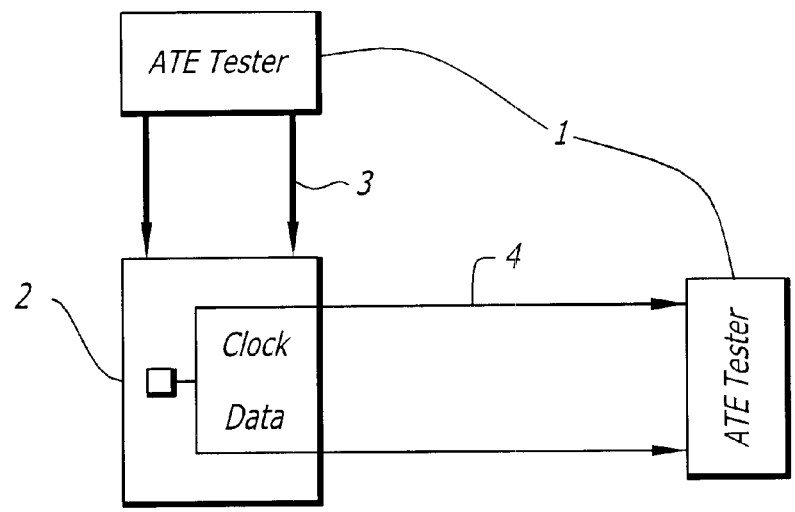
FIG. 2 is a schematic showing an automatic test equipment of the prior art.
Figure 3:
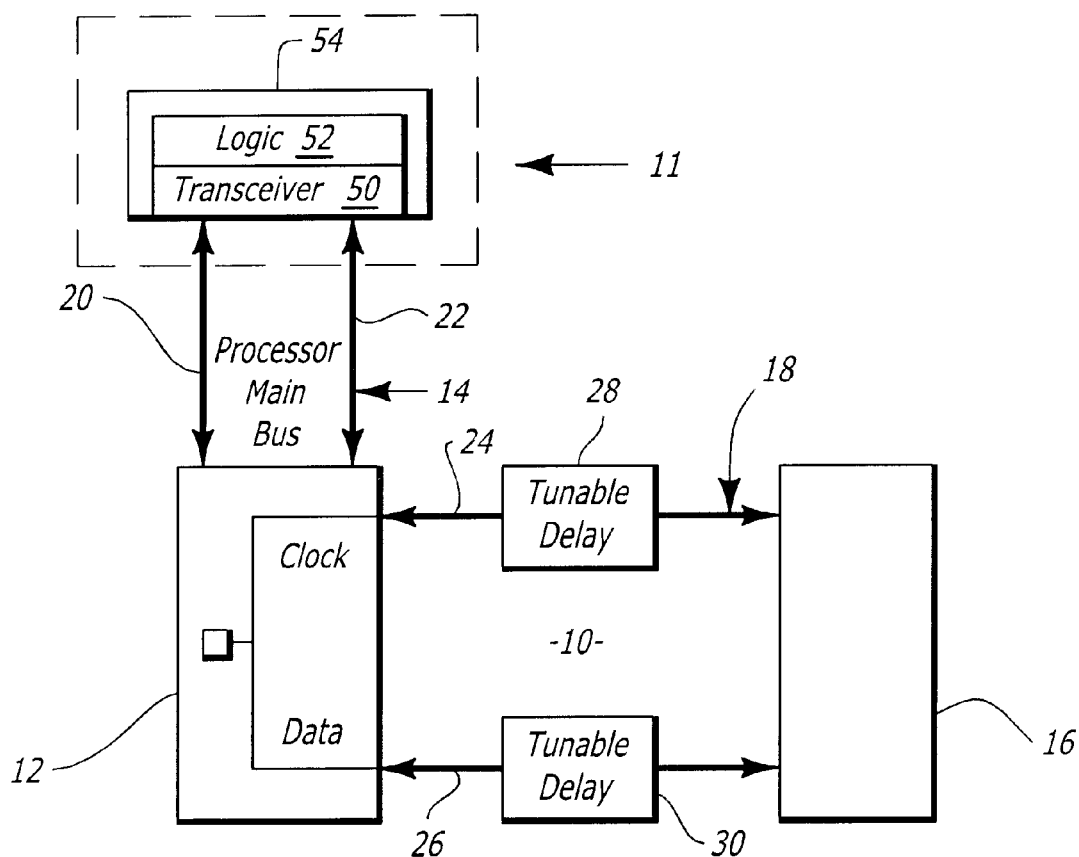
FIG. 3 is a schematic showing an embodiment of an apparatus of the present invention.

Referring to the drawings more particularly by reference numbers, FIG. 3 shows an embodiment of an apparatus 10 of the present invention. The apparatus 10 may include automatic test equipment (ATE) 11. The apparatus can be used to test a device under test (DUT) 12. By way of example, the DUT 12 may be an integrated circuit such as a microprocessor. The ATE 11 may be connected to the DUT 12 by a frontside bus 14. The DUT 12 may be connected to a secondary device 16 by a backside bus 18. The secondary device 16 may be a level 2 cache memory device that can both read and write data with the DUT 12 through the backside bus 18. The cache memory device is typically an integrated circuit that is designed to operate with the DUT processor 12. By implementing the secondary device 16 in the test method of the present invention the ATE 11 does not have to be upgraded when the processor operates at a frequency that exceeds the speed of the tester, because each upgraded processor may have a corresponding secondary device.

The frontside bus 14 may include both data 20 and clock 22 lines that carry data and clock signal between the ATE 11 and DUT 12. Likewise, the backside bus 18 may also have data 26 and clock 24 lines to carry data and clock signals between the DUT 12 and the secondary device 16. The backside bus 18 may also include a tunable clock delay line 28 and a tunable data delay line 30. The tunable delay lines 28 and 30 may be circuits that introduce additional transmission length and corresponding propagation delays in the data and clock signals in the backside bus 18. The tunable delay lines 28 and 30 can be replaced with other delay lines that have different line lengths to allow an operator to vary the propagation delay time of the signals. As an alternate embodiment, a plurality of different clock delay lines 28, each have a different line length, can be connected to a multiplexor (not shown) so that the propagation delay time of the clock signal can be automatically adjusted. Likewise, the ATE 11 may have a plurality of multiplexed data delay lines 30, each having a different line lengh, to allow the propagation delay times of each data signal to be automatically adjusted.

Figure 4:
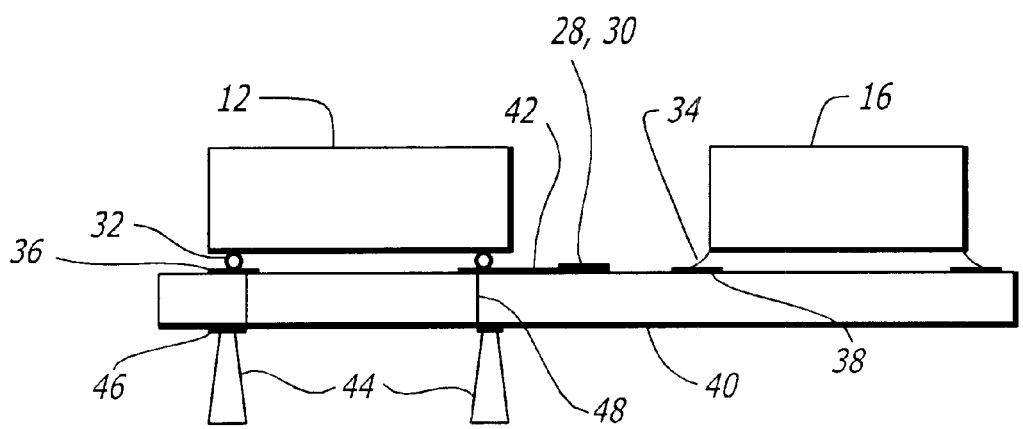
FIG. 4 is a side view showing a printed circuit board that couples a device under test to a secondary device.

As shown in FIG. 4, the DUT 12 and secondary device 16 may each have electrical contacts 32 and 34, respectively.

The electrical contacts 32 and 34 may be in electrical contact with a plurality of surface pads 36 and 38, respectively, of a printed circuit board 40. The DUT 12 and secondary device 16 may be pressed into the circuit board 40 by a spring (not shown), or other force means. The surface pads 36 and 38 may be connected by routing traces 42 and the delay circuits 28 and 30 to form the backside bus 18.

The apparatus 10 may include a plurality of spring biased pogo pins 44 that engage a plurality of surfaces pads 46 on the bottom of the printed circuit board 40. The bottom pads 46 may be electrically connected to the top pads 36 by vias 48. The pogo pins 44 provide an interconnection for the frontside bus 14. By implementing the secondary device 16, the ATE 11 does not require pogo pins for the backside bus 18. Eliminating the backside bus pogo pins decreases the cost of producing the apparatus 10.

Referring again to FIG. 3, the ATE 11 may have a transceiver circuit 50 that can transmit and receive data and clock signals to and from the DUT 12 through the frontside bus 14. The DUT 12 can store the data signal(s) in conjunction with the clock signal. The DUT 12 can also transmit original data and clock signals to the secondary device 16 through the backside bus 18. The secondary device 16 can store the data signal as a return data signal in conjunction with the clock signal. The secondary device 16 can write the return data signal back to the DUT 12 through the backside bus 18. The DUT 12 can then write the return data signal back to the ATE 12. The return data is compared with the original write data in a logic circuit 52 of the ATE 11. If the return data does not equal the original data the logic circuit 52 may generate a "fail" signal. If the return data equals the original data then the logic circuit 52 may generate a "pass" signal. By way of example, if the original write data is a binary 1 then the logic circuit 54 will generate a pass signal if the return data is a binary 1, or a fail signal if the return data is a binary 0.

The ATE 11 can be used to determine whether the DUT 12 has a Tvb parameter and a Tva parameter that complies with a design specification for the device 12. The Tvb parameter may be the sum of a setup time and a setup margin. The Tva parameter may be the sum of a hold time and a hold margin. The secondary device 16 may have a setup time and/or a hold time that is greater than the setup time and/or hold time defined in the DUT specification. The tunable clock delay line 28 delays the clock signal to compensate for the difference between the hold time of the DUT specification and the actual hold time of the secondary device 16. Likewise, the tunable data delay line 30 can delay the data signal(s) to compensate for differences between the setup time of the DUT specification and the actual setup time of the secondary device. The actual hold and setup times of the secondary device 16 can be measured. The appropriate delay lines 28 and 30 can then be selected to compensate for any differences with the DUT specification.

To determine whether the DUT 12 complies with the Tva specification, the tunable clock delay line 28 is enabled within the backside bus 18. The tunable data delay line 30 is disabled. The ATE 11 writes data to the DUT 12, which writes the data to the secondary device 16. The clock signal provided to the secondary device 16 is delayed by the delay line 28. The secondary device 16 then writes the data back to the ATE 11 through the DUT 12 and busses 14 and 18. The ATE 11 compares the received data with the originally transmitted data to determine a pass or fail condition.

To determine whether the DUT 12 complies with the Tvb specification, the tunable data delay line 30 is enabled and the tunable clock delay line 28 is disabled. The ATE 11 writes data to the secondary device 16 through the DUT 12. The secondary device 16 then writes the data back to the ATE 11 through the DUT 12, wherein the ATE 11 compares the original and return data to determine a pass or fail condition.

The hold margin can be characterized by varying the delay length of the clock delay line 28 after each pass or fail test routine. The delay time can be gradually varied to a differential time Δt until the ATE 11 generates a fail signal. The hold signal margin may be proportional to the differential delay time Δt required to create a fail condition. Likewise the setup margin can be characterized by varying the delay length of the data delay line 30 after each pass or fail routine.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus for testing a device under test (DUT) that can be coupled to a secondary device, comprising:
   a frontside bus adapted to be coupled to the DUT;
   a backside bus adapted to be coupled to the DUT and the secondary device, said backside bus supporting a transmission of a data signal and a clock signal from the DUT to the secondary device and at least a return data signal from the secondary device.

2. The apparatus of claim 1, wherein said backside bus includes a printed circuit board.

3. The apparatus of claim 1, wherein said frontside bus includes a pogo pin.

4. The apparatus of claim 1, wherein said backside bus includes a first tunable delay line having a circuit to introduce additional transmission length and propagation delay to at least one of said data signals and said return data signal.

5. The apparatus of claim 4, wherein said delay imposed by said circuit of said first tunable delay line is generally equivalent to a difference between a setup time according to a specification of the DUT and an actual setup time of the secondary device.

6. The apparatus of claim 1, wherein a backside bus includes a first tunable delay line having a circuit to introduce transmission length and propagation delay to said data signal.

7. The apparatus of claim 6, wherein said backside bus further includes a second tunable delay line having a circuit to introduce transmission length and propagation delay to said clock signal.

8. The apparatus of claim 7, wherein the delay imposed by said circuit of said second tunable delay line is generally equivalent to a hold time according to a specification for the DUT and an actual hold time of the secondary device.

9. The apparatus of claim 7, wherein said first tunable delay line is enabled and said second tunable delay line is disabled to determine whether a Tvb parameter of the DUT is less than or equal to a predetermined value.

10. The apparatus of claim 7, wherein said second tunable delay line is enabled and said first tunable delay line is disabled to determine whether a Tva paramenter of the DUT is less than or equal to a predetermined value.

11. The apparatus of claim 1, wherein the secondary device is a cache memory.

12. The apparatus of claim 1 further comprising:
an automatic test equipment (ATE) coupled to the frontside bus.

13. The apparatus of claim 12, wherein the ATE to originally provide the data signal and the clock signal to the DUT.

14. The apparatus of claim 13, wherein the ATE including
a transceiver circuit adapted to send the data signal and the clock signal to the DUT and to receive at least the return data signal for the DUT; and
a logic circuit to compare the data signal to the return data signal.

15. A method for testing a data signal and a clock signal, comprising;
transmitting an original data signal from an automatic test equipment (ATE) to a device under test (DUT);
transmitting the original data signal and a clock signal from the DUT to a secondary device;
storing the original data signal as a return data signal within the secondary device;
transmitting the return data signal from the secondary device to the DUT;
transmitting the return data signal from the DUT to the ATE; and,
comparing the return data signal with the original data signal.

16. The method of claim 15, further comprising the step of delaying the clock signal between the DUT and the secondary device.

17. The method of claim 16, further comprising the step of varying a delay time of the clock signal to characterize a hold margin.

18. The method of claim 15, further comprising the step of delaying the data line between the DUT and secondary device.

19. The method of claim 18, further comprising the step of varying a delay time of the data signal to characterize a setup time.

* * * * *

UNITED STATES PATENT AND TRADEMARK OFFICE
CERTIFICATE OF CORRECTION

PATENT NO. : 6,449,742 B1
DATED : September 10, 2002
INVENTOR(S) : Arabi et al.

It is certified that error appears in the above-identified patent and that said Letters Patent is hereby corrected as shown below:

Column 2,
Line 46, delete "signal", insert -- signals --.

Signed and Sealed this

Seventh Day of September, 2004

JON W. DUDAS
*Director of the United States Patent and Trademark Office*